United States Patent
Li et al.

(10) Patent No.: US 12,094,748 B2
(45) Date of Patent: Sep. 17, 2024

(54) BIPOLAR ESC WITH BALANCED RF IMPEDANCE

(71) Applicant: Applied Materials, Inc., Santa Clara, CA (US)

(72) Inventors: Jian Li, Fremont, CA (US); Edward P. Hammond, Hillsborough, CA (US); Juan Carlos Rocha-Alvarez, San Carlos, CA (US); Dmitry A. Dzilno, Sunnyvale, CA (US); Wenhao Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 17/405,929

(22) Filed: Aug. 18, 2021

(65) Prior Publication Data
US 2023/0054444 A1  Feb. 23, 2023

(51) Int. Cl.
*H01L 21/683* (2006.01)
*H01J 37/32* (2006.01)
(Continued)

(52) U.S. Cl.
CPC .... *H01L 21/6833* (2013.01); *H01J 37/32357* (2013.01); *H01J 37/32724* (2013.01);
(Continued)

(58) Field of Classification Search
CPC ........ H01L 21/67196; H01L 21/67103; H01L 21/6831; H01L 21/6719; H01L 21/6833;
(Continued)

(56) References Cited

U.S. PATENT DOCUMENTS

| 6,280,584 B1 * | 8/2001 | Kumar | H02N 13/00 |
| | | | 204/192.12 |
| 2003/0169553 A1 * | 9/2003 | Brown | H02N 13/00 |
| | | | 361/234 |

(Continued)

FOREIGN PATENT DOCUMENTS

| JP | 2018123348 A | 8/2018 |
| KR | 20210016929 A | 2/2021 |

(Continued)

OTHER PUBLICATIONS

International Search Report and Written Opinion mailed on Dec. 1, 2022 in International Patent Application No. PCT/US2022/040481, 12 pages.

*Primary Examiner* — Kevin J Comber
(74) *Attorney, Agent, or Firm* — Kilpatrick Townsend & Stockton LLP

(57) ABSTRACT

Exemplary substrate processing systems may include a chamber body defining a transfer region. The systems may include a lid plate seated on the chamber body. The lid plate may define a plurality of apertures. The systems may include a plurality of lid stacks equal to a number of the plurality of apertures. The systems may include a plurality of substrate support assemblies equal to the number of apertures defined through the lid plate. Each assembly may be disposed in one of the processing regions and may include an electrostatic chuck body defining a substrate support surface that defines a substrate seat. Each assembly may include a heater embedded within the chuck body. Each assembly may include bipolar electrodes between the heater and the substrate support surface. Each assembly may include a conductive mesh embedded within the body between the heater and bipolar electrodes.

19 Claims, 8 Drawing Sheets

(51) Int. Cl.
*H01L 21/67* (2006.01)
*H05B 3/22* (2006.01)

(52) U.S. Cl.
CPC ......... *H01L 21/67196* (2013.01); *H05B 3/22* (2013.01); *H01L 21/67167* (2013.01)

(58) Field of Classification Search
CPC .......... H01L 21/68771; H01L 21/67167; H01J 37/32357; H01J 37/32724; H05B 3/22
USPC ....................................................... 361/234
See application file for complete search history.

(56) References Cited

U.S. PATENT DOCUMENTS

| | | | | |
|---|---|---|---|---|
| 2015/0380217 | A1* | 12/2015 | Rocha-Alvarez | ....... C23C 16/46 118/723 R |
| 2017/0306494 | A1* | 10/2017 | Lin | .................. H01J 37/32082 |
| 2018/0358222 | A1* | 12/2018 | Venkatasubramanian | .................. C23C 16/505 |
| 2021/0013069 | A1 | 1/2021 | Kalsekar et al. | |

FOREIGN PATENT DOCUMENTS

| | | | |
|---|---|---|---|
| TW | 202004980 A | 1/2020 | |
| TW | 202020973 A | 6/2020 | |
| TW | 202109706 A | 3/2021 | |
| TW | 202129794 A | 8/2021 | |
| TW | 202130980 A | 8/2021 | |
| WO | WO-2021080953 A1 * | 4/2021 | ......... C23C 16/4581 |

\* cited by examiner

BIPOLAR ESC WITH BALANCED RF IMPEDANCE

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate. Additionally, as cluster tools scale, component configurations may no longer adequately support processing or maintenance operations.

Thus, there is a need for improved systems and methods that can be used to efficiently direct substrates within cluster tool environments. These and other needs are addressed by the present technology.

SUMMARY

Exemplary substrate processing systems may include a chamber body that defines a transfer region. The systems may include a lid plate seated on the chamber body. The lid plate may define a plurality of apertures through the lid plate. The systems may include a plurality of lid stacks equal to a number of apertures defined through the lid plate. The plurality of lid stacks may at least partially define a plurality of processing regions vertically offset from the transfer region. The systems may include a plurality of substrate support assemblies equal to the number of apertures defined through the lid plate. Each substrate support assembly of the plurality of substrate support assemblies may be disposed in a respective one of the plurality of processing regions. Each substrate support assembly of the plurality of substrate support assemblies may include an electrostatic chuck body defining a substrate support surface that defines a substrate seat. The assemblies may include a heater embedded within the electrostatic chuck body. The assemblies may include a first bipolar electrode embedded within the electrostatic chuck body between the heater and the substrate support surface. The assemblies may include a second bipolar electrode embedded within the electrostatic chuck body between the heater and the substrate support surface. The assemblies may include a conductive mesh embedded within the electrostatic body between the heater and the first and second bipolar electrodes.

In some embodiments, the conductive mesh may include molybdenum. Peripheral edges of the heater and the conductive mesh may be at least substantially vertically aligned with peripheral edges of the first and second bipolar electrodes. The conductive mesh may be positioned between about 40% and 60% of a distance from the heater and the first and second bipolar electrodes. The systems may include a faceplate positioned atop the lid plate. The systems may include a blocker plate seated on the faceplate. The systems may include a faceplate heater seated on the faceplate and positioned radially outward of the blocker plate. The systems may include a gasbox seated on the blocker plate. The conductive mesh may be closer to the heater than to the first and second bipolar electrodes. The conductive mesh may include a first plurality of wires arranged along a first direction. The conductive mesh may include a second plurality of wires arranged along a second direction that is at least substantially orthogonal to the first direction. A thickness of the conductive mesh may be between about 0.5 mm and 1.5 mm. The heater may include an inner heater zone and an outer heater zone. The heater may include a jump line that couples the outer heater zone with a power rod. A gap between the first bipolar electrode and the second bipolar electrode may be aligned with the jump line. The systems may include an RF power supply coupled with both of the first bipolar electrode and the second bipolar electrode.

Some embodiments of the present technology may also encompass substrate processing chamber substrate support assemblies. The assemblies may include an electrostatic chuck body defining a substrate support surface that defines a substrate seat. The assemblies may include a heater embedded within the electrostatic chuck body. The assemblies may include a first bipolar electrode embedded within the electrostatic chuck body between the heater and the substrate support surface. The assemblies may include a second bipolar electrode embedded within the electrostatic chuck body between the heater and the substrate support surface. The assemblies may include a conductive mesh embedded within the electrostatic body between the heater and the first and second bipolar electrodes.

In some embodiments, the conductive mesh may be positioned between about 40% and 60% of a distance from the heater and the first and second bipolar electrodes. The heater may include an inner heater zone and an outer heater zone. The heater may include a jump line that couples the outer heater zone with a power rod. A gap between the first bipolar electrode and the second bipolar electrode may be aligned with the jump line. A thickness of the conductive mesh may be between about 0.5 mm and 1.5 mm. The conductive mesh may include a conductive material having a coefficient of thermal expansion that is within about 20% of a coefficient of thermal expansion of the electrostatic chuck body.

Some embodiments of the present technology may also encompass substrate processing systems. The systems may include a processing chamber defining a processing region. The systems may include a substrate support assembly. The assembly may include an electrostatic chuck body defining a substrate support surface that defines a substrate seat. The assembly may include a heater embedded within the electrostatic chuck body. The assembly may include a first bipolar electrode embedded within the electrostatic chuck body between the heater and the substrate support surface. The assembly may include a second bipolar electrode embedded within the electrostatic chuck body between the heater and the substrate support surface. The assembly may include a conductive mesh embedded within the electrostatic body between the heater and the first and second bipolar electrodes. The systems may include a faceplate positioned above the substrate support assembly. In some embodiments, the systems may include a blocker plate seated on the faceplate.

Such technology may provide numerous benefits over conventional systems and techniques. For example, the processing systems may provide multi-substrate processing capabilities that may be scaled well beyond conventional designs. Additionally, each chamber system may include a substrate support assembly that includes a floating mesh that helps balance an RF impedance about the surface of a substrate support. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
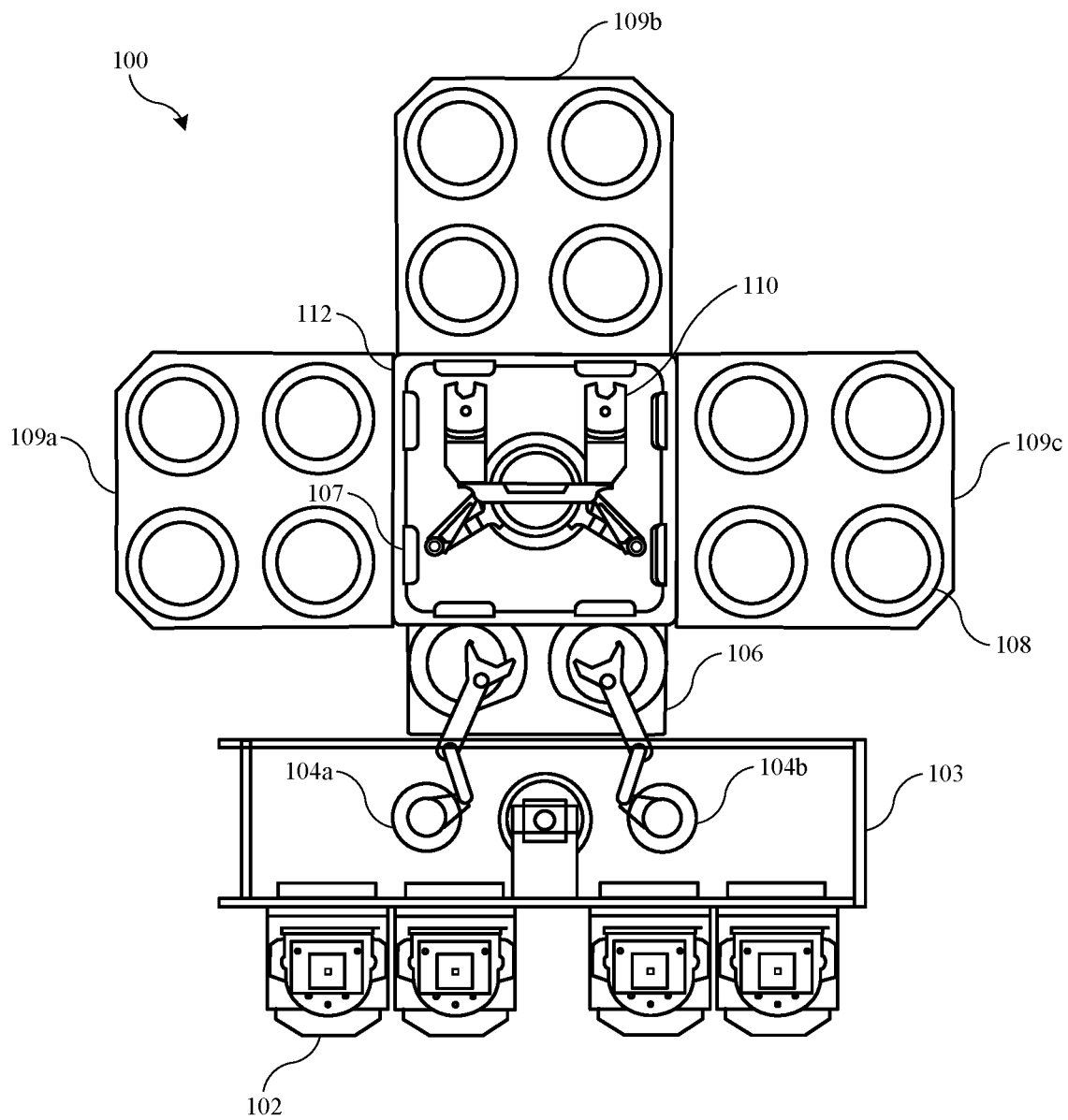
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

With shrinking nodes on the wafer, the variables that contribute to the on wafer performance increase. Variables contributing to on wafer planar uniformity may include an RF impedance from RF electrodes in embodiments utilizing bipolar chucking electrodes. In such embodiments, the impedance from ground to the RF mesh may be different on each half of the mesh. One cause of such issues may be RF coupling between the RF mesh and the heating element. For example, the heating element may not be perfectly uniform in shape, which may mean that a portion of the heater positioned below each half of the RF mesh may be different, with the difference contributing to RF impedance non-uniformity and subsequently causing non-uniformity issues on wafer. This non-uniformity may also be sensitive to the RF frequency, with some frequencies causing greater non-uniformity issues than other frequencies.

To address these and other concerns, embodiments of the present technology may incorporate a floating mesh that is positioned between the RF electrodes and the heater. The floating mesh may decouple the RF mesh from the heater. The floating mesh may be substantially uniform in shape, which may ensure that the RF coupling and impedance on both halves of the RF mesh is substantially uniform, which may also help reduce the frequency sensitivity of the processing operations. Some embodiments may also align the gap between halves of the RF mesh with a jump line of the heater, which may further increase the RF impedance uniformity exhibited between the two halves of the RF mesh. Such features may help improve film uniformity on wafer.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
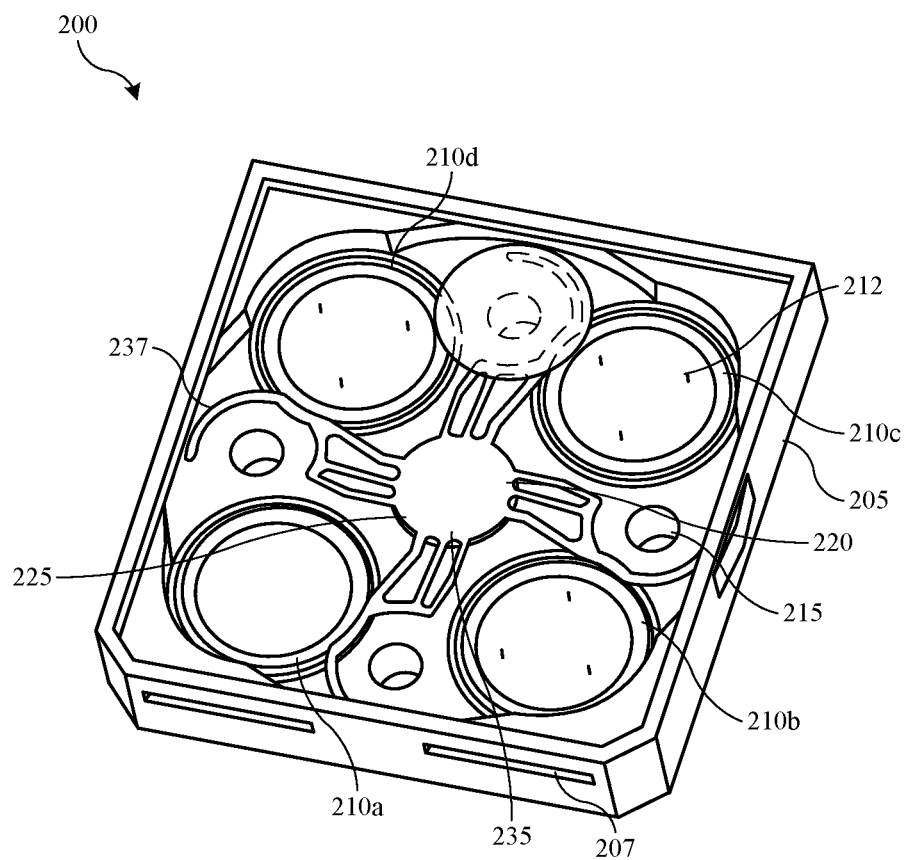
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
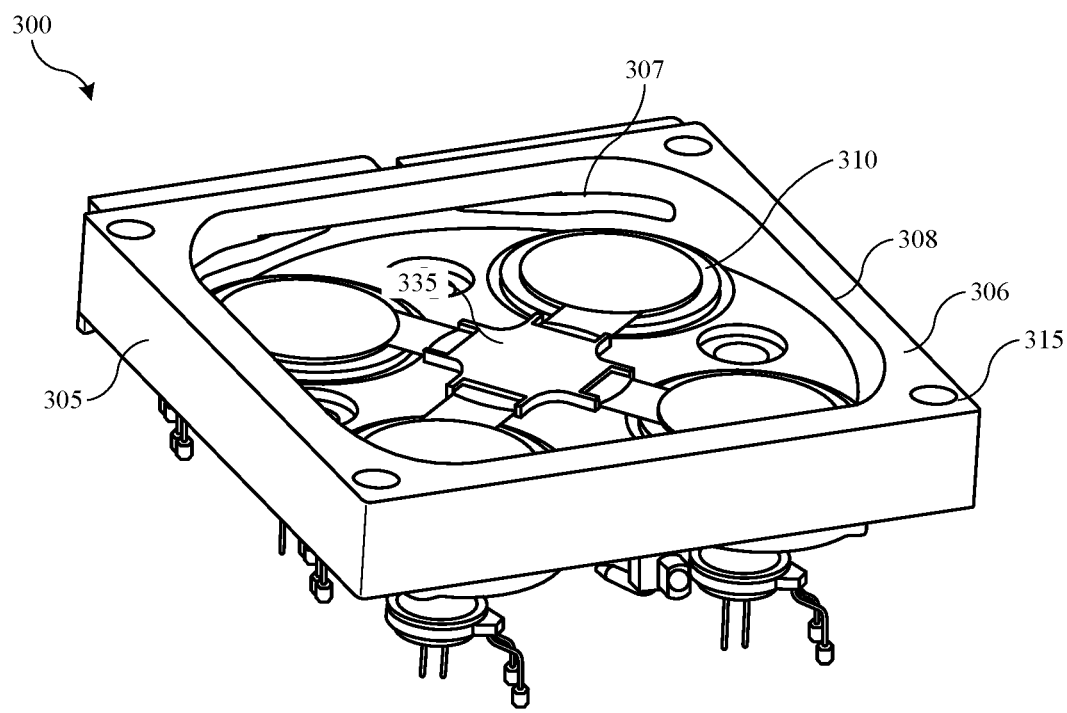
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above.

FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
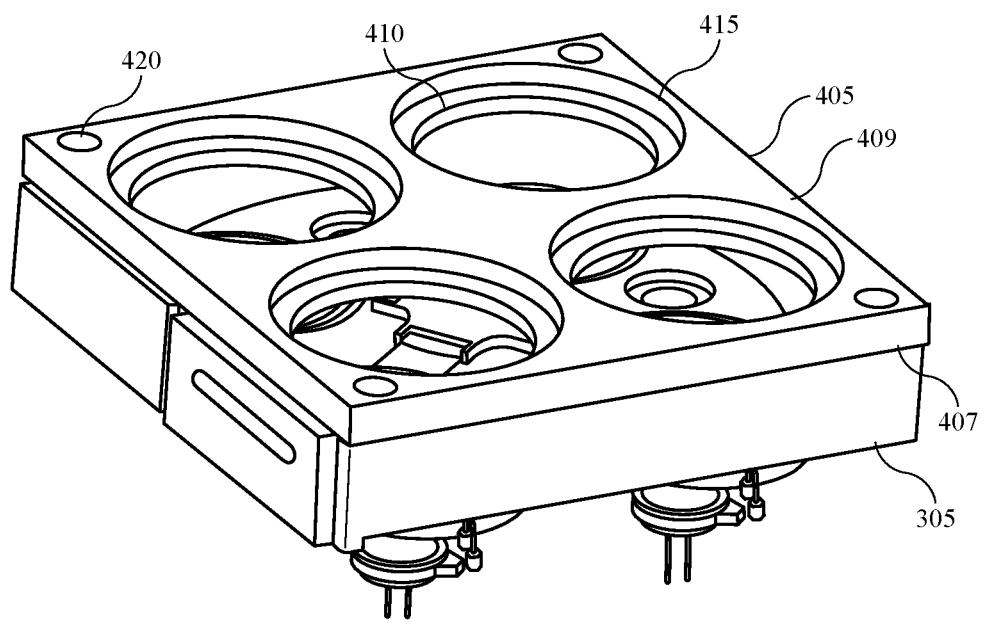
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
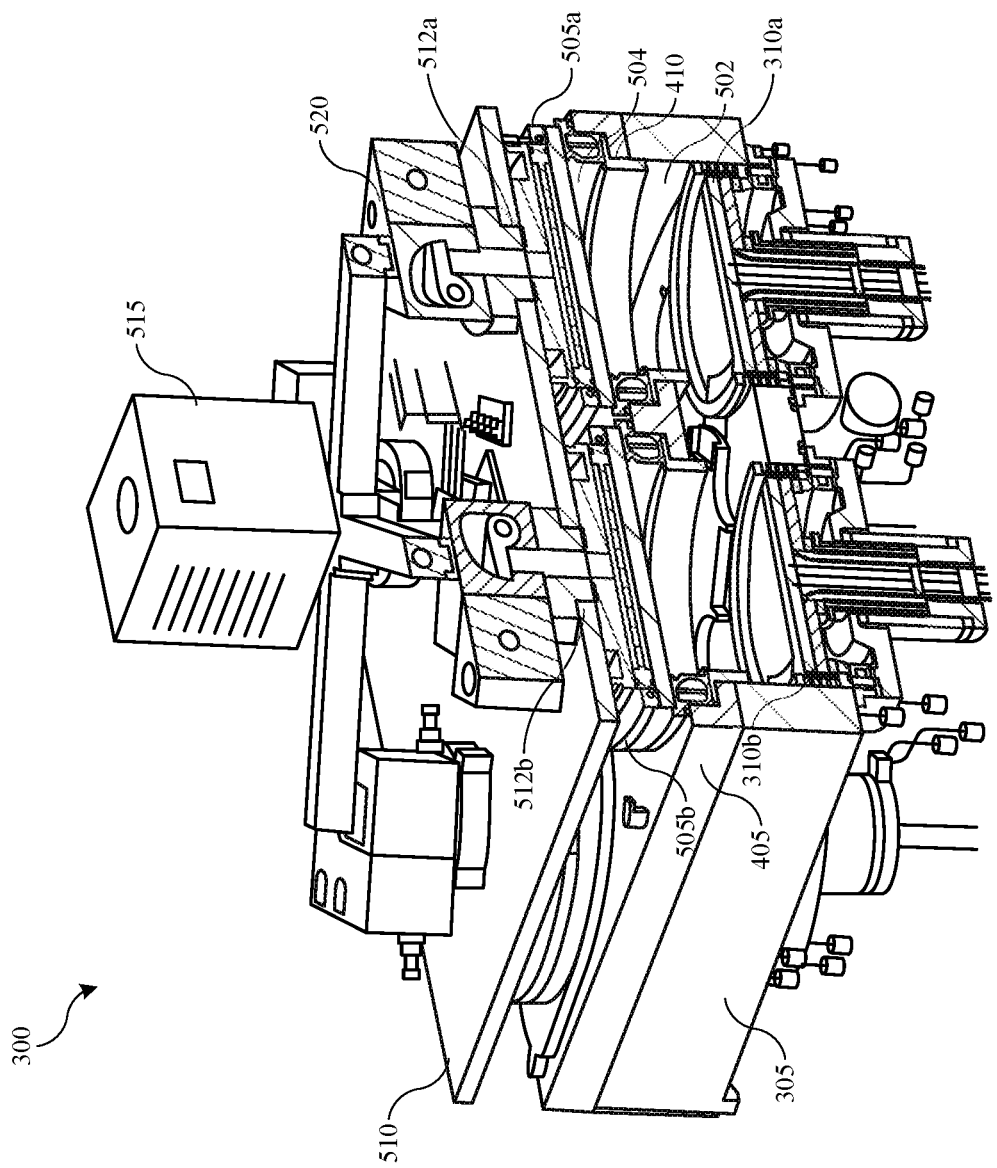
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505a may be aligned over substrate support 310a, and lid stack 505b may be aligned over substrate support 310b. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512a may provide fluid access to lid stack 505a. Aperture 512a may also be axially aligned with any of the lid stack components, as well as with substrate support 310a in some embodiments, which may produce an axial alignment for each of the components associated with individual processing regions, such as along a central axis through the substrate support or any of the components associated with a particular processing region 504. Similarly, aperture 512b may provide fluid access to lid stack 505b, and may be aligned, including axially aligned with components of the lid stack as well as substrate support 310b in some embodiments.

Figure 6:
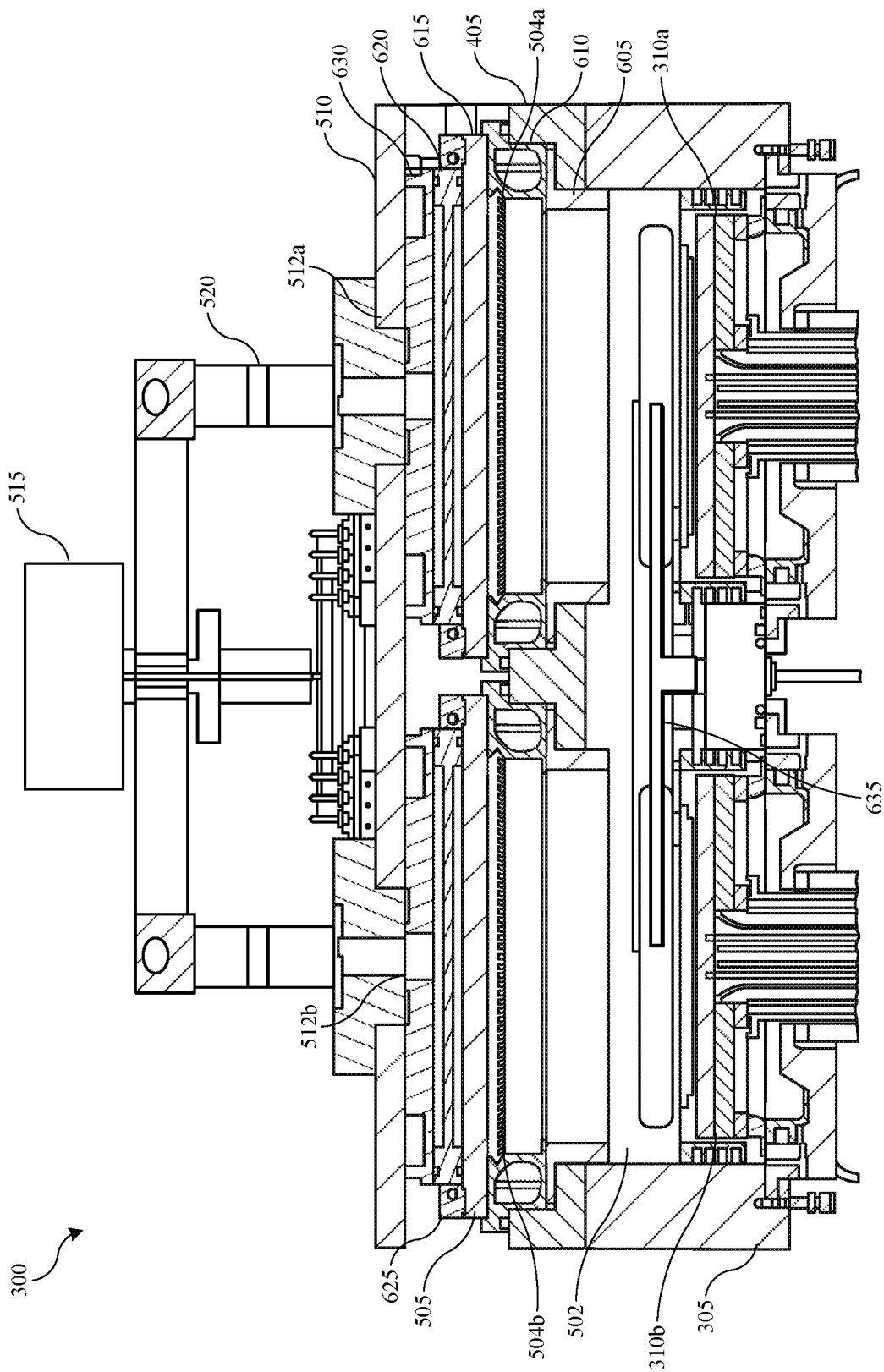
FIG. 6 shows a schematic partial cross-sectional view of an exemplary chamber system according to some embodiments of the present technology.

FIG. 6 shows a schematic cross-sectional elevation view of one embodiment of chamber system 300 according to some embodiments of the present technology. FIG. 6 may illustrate the cross-sectional view shown above in FIG. 5, and may further illustrate components of the system. The figure may include components of any of the systems illustrated and described previously, and may also show further aspects of any of the previously described systems. It is to be understood that the illustration may also show exemplary components as would be seen through any two adjacent processing regions 108 in any quad section 109 described above. The elevation view may illustrate the configuration or fluid coupling of one or more processing regions 504 with a transfer region 502. For example, a continuous transfer region 502 may be defined by chamber body 305. The housing may define an open interior volume in which a number of substrate supports 310 may be disposed. For example, as illustrated in FIG. 1, exemplary processing systems may include four or more, including a plurality of substrate supports 310 distributed within the chamber body about the transfer region. The substrate supports may be pedestals as illustrated, although a number of other configurations may also be used. In some embodiments the pedestals may be vertically translatable between the transfer region 502 and the processing regions 504 overlying the transfer region. The substrate supports may be vertically translatable along a central axis of the substrate support along a path between a first position and a second position within the chamber system. Accordingly, in some embodiments each substrate support 310 may be axially aligned with an overlying processing region 504 defined by one or more chamber components.

The open transfer region may afford the ability of a transfer apparatus 635, such as a carousel, to engage and move substrates, such as rotationally, between the various substrate supports. The transfer apparatus 635 may be rotatable about a central axis. This may allow substrates to be positioned for processing within any of the processing regions 504 within the processing system. The transfer apparatus 635 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 635 and deliver the substrates into the processing regions 504, which may be vertically offset from the transfer region 502. For example, and as illustrated, substrate support 310a may deliver a substrate into processing region 504a, while substrate support 310b may deliver a substrate into processing region 504b. This may occur with the other two substrate supports and processing regions, as well as with additional substrate supports and processing regions in embodiments for which additional processing regions are included. In this configuration, the substrate supports may at least partially define a processing region 504 from below when operationally engaged for processing substrates, such as in the second position, and the processing regions may be axially aligned with an associated substrate support. The processing regions may be defined from above by the components of the lid stacks 505, which may each include one or more of the illustrated components. In some embodiments, each processing region may have individual lid stack components, although in some embodiments components may accommodate multiple processing regions 504. Based on this configuration, in some embodiments each processing region 504 may be fluidly coupled with the transfer region, while being fluidly isolated from above from each other processing region within the chamber system or quad section.

The lid stack 505 may include a number of components, which may facilitate flow of precursors through the chamber system, and may be at least partially contained between the first lid plate 405 and the second lid plate 510. A liner 605 may be seated directly on the shelf formed by each recessed ledge in first lid plate 405. For example, liner 605 may define a lip or flange, which may allow liner 605 to extend from the shelf of first lid plate 405. Liner 605 may extend vertically below the first surface of first lid plate 405 in some embodiments, and may at least partially extend into the open transfer region 502. The liner 605 may be made of materials similar or different from the chamber body materials, and may be or include materials that limit deposition or retention of materials on the surface of liner 605. Liner 605 may define an access diameter for substrate support 310, and may be characterized by any of the gap amounts described above for clearance between the substrate support 310 and the liner 605 when included.

Seated on the liner 605 may be a pumping liner 610, which may at least partially extend within the recess or along the recessed ledge defined in the second surface of first lid plate 405. In some embodiments, pumping liner 610 may be seated on liner 605 on the shelf formed by the recessed ledge. Pumping liner 610 may be an annular component, and may at least partially define the processing region 504 radially, or laterally depending on the volume geometry. The pumping liner may define an exhaust plenum within the liner, which may define a plurality of apertures on an inner annular surface of the pumping liner providing access to the exhaust plenum. The exhaust plenum may at least partially extend vertically above a height of the first lid plate 405, which may facilitate delivering exhausted materials through an exhaust channel formed through the first lid plate and chamber body as previously described. A portion of the pumping liner may at least partially extend across the second surface of the first lid plate 405 to complete the exhaust channel between the exhaust plenum of the pumping liner, and the channel formed through the chamber body and first lid plate.

A faceplate 615 may be seated on the pumping liner 610, and may define a plurality of apertures through the faceplate 615 for delivering precursors into the processing region 504. Faceplate 615 may at least partially define an associated processing region 504 from above, which may at least partially cooperate with the pumping liner and substrate support in a raised position to generally define the processing region. Faceplate 615 may operate as an electrode of the system for producing a local plasma within the processing region 504, and thus in some embodiments, faceplate 615 may be coupled with an electrical source or may be grounded. In some embodiments the substrate support 310 may operate as the companion electrode for generating a capacitively-coupled plasma between the faceplate and the substrate support.

A blocker plate 620 may be seated on the faceplate 615, which may further distribute processing fluids or precursors to produce a more uniform flow distribution to a substrate. Blocker plate 620 may also define a number of apertures through the plate. In some embodiments the blocker plate 620 may be characterized by a diameter less than a diameter of the faceplate as illustrated, which may provide an annular access on the surface of the faceplate radially outward from the blocker plate 620. In some embodiments a faceplate heater 625 may be seated on the annular access, and may contact faceplate 615 to heat the component during processing or other operations. In some embodiments, blocker plate 620 and faceplate heater 625 may be characterized together as having an outer radial diameter equal to or substantially equal to an outer radial diameter of faceplate 615. Similarly, faceplate heater 625 may be characterized as having an outer radial diameter equal to or substantially equal to an outer radial diameter of faceplate 615 in some embodiments. Faceplate heater 625 may extend about blocker plate 620, and may or may not directly contact blocker plate 620 on an outer radial edge of the blocker plate 620.

A gas box 630 may be positioned above the blocker plate 620, and the gas box 630 of each of the lid stacks 505 may at least partially support the second lid plate 510. Gas box 630 may define a central aperture that is aligned with an associated aperture 512 of the plurality of apertures defined through second lid plate 510. Second lid plate 510 may support a remote plasma unit 515 in some embodiments, which may include piping to each of the apertures 512, and into each processing region 504. Adapters may be positioned through apertures 512 to couple the remote plasma unit piping to the gas boxes 630. Additionally, isolation valves 520 may be positioned within the piping to meter flow to each individual processing region 504 in some embodiments.

O-rings or gaskets may be seated between each component of the lid stack 505, which may facilitate vacuum processing within chamber system 300 in some embodiments. The specific component coupling between the first lid plate 405 and the second lid plate 510 may occur in any number of ways, which may facilitate accessing system components. For example, a first set of couplings may be incorporated between the first lid plate 405 and the second lid plate 510, which may facilitate removal of both lid plates and each lid stack 505, which may provide access to the substrate supports or transfer apparatus within the transfer region of the chamber system. These couplings may include any number of physical and removable couplings extending between the two lid plates, which may allow them to be separated from the chamber body 305 as a whole. For example, a drive motor on a mainframe containing the chamber system 300 may be removably coupled with the second lid plate 510, which may lift the components away from the chamber body 305.

When the couplings between the first lid plate 405 and second lid plate 510 are disengaged, second lid plate 510 may be removed while first lid plate 405 may remain on chamber body 305, which may facilitate access to one or more components of the lid stacks 505. The break within the lid stack 505 may occur between any two components described previously, some of which may be coupled with first lid plate 405, and some of which may be coupled with second lid plate 510. For example, in some embodiments each of the gas boxes 630 may be coupled with second lid plate 510. Thus, when the second lid plate is lifted from the chamber system, the gas boxes may be removed, providing access to the blocker plate and faceplate. Continuing this example, the blocker plate 620 and faceplate 615 may or may not be coupled with the first lid plate 405. For example, although mechanical coupling may be included, the components may be decoupled and sit floating on the first lid plate 405, such as with locating features maintaining proper alignment of the components. It is to be understood that the example is intended to be non-limiting, and illustrative of any number of break configurations between any two components of the lid stack when the second lid plate 510 is separated from the first lid plate 405. Consequently, depending on the coupling between the first lid plate and second lid plate, the entire lid stack and both lid plates may be removed providing access to the transfer region, or the second lid plate may be removed providing access to the lid stack components.

Figure 7:
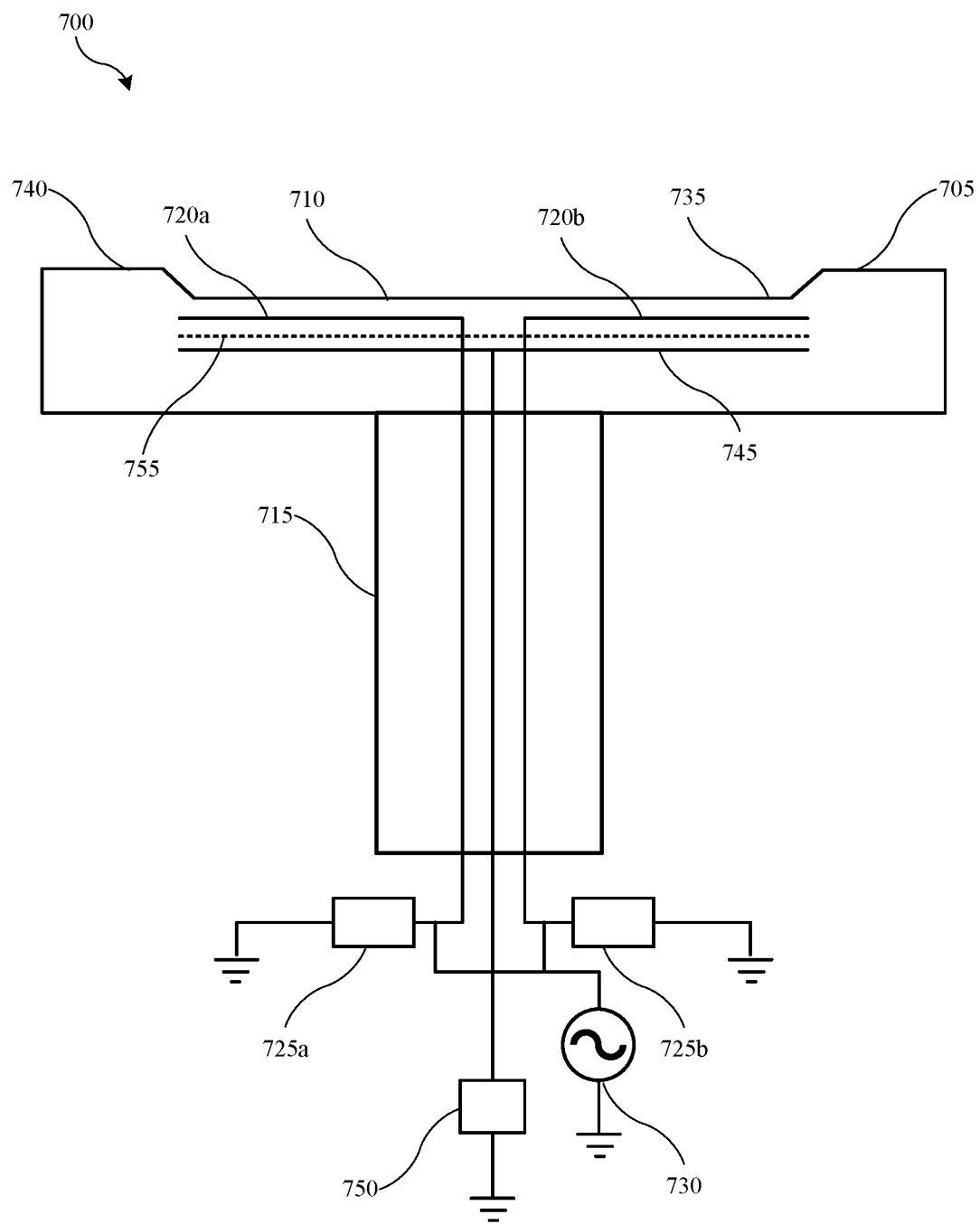
FIG. 7 shows a schematic partial cross-sectional view of an exemplary substrate support assembly according to some embodiments of the present technology.

FIG. 7 shows a schematic cross-sectional side elevation view of an exemplary substrate support assembly 700 according to some embodiments of the present technology. FIG. 7 may illustrate further details relating to components in systems 100, 200, and 300, such as substrate support assembly 310. Substrate support assembly 700 is understood to include any feature or aspect of systems 100, 200, and/or 300 discussed previously in some embodiments. The substrate support assembly 700 may be used to perform semiconductor processing operations, such as deposition, removal, and cleaning operations. Substrate support assembly 700 may show a partial view of the chamber components being discussed and that may be incorporated in a semiconductor processing system. Any aspect of substrate support assembly 700 may also be incorporated with other processing chambers or systems as will be readily understood by the skilled artisan.

The substrate support assembly 700 may include an electrostatic chuck body 705, which may include one or more components embedded or disposed within the body. The components incorporated within the top puck may not be exposed to processing materials in some embodiments, and may be fully retained within the chuck body 705. Electrostatic chuck body 705 may define a substrate support surface 710, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 705 may be coupled with a stem 715, which may support the chuck body and may include channels for delivering and receiving electrical and/or fluid lines that may couple with internal components of the chuck body 705. Chuck body 705 may include associated channels or components to operate as an electrostatic chuck, although in some embodiments the assembly may operate as or include components for a vacuum chuck, or any other type of chucking system. Stem 715 may be coupled with the chuck body on a second surface of the chuck body opposite the substrate support surface 710. In some embodiments, the electrostatic chuck body 705 may be formed from a conductive material (such as a metal like aluminum or any other material that may be thermally and or electrically conductive) and may be coupled with a source of electric power (such as DC power, pulsed DC power, RF bias power, a pulsed RF source or bias power, or a combination of these or other power sources) through a filter, which may be an impedance matching circuit to enable the electrostatic chuck body 705 to operate as an electrode. In other embodiments, a top portion of the electrostatic chuck body 705 may be formed from a dielectric material. In such embodiments, the electrostatic chuck body 705 may include separate electrodes. For example, the electrostatic chuck body 705 may include a first bipolar electrode 720a, which may be embedded within the chuck body 705 proximate the substrate support surface 710. Electrode 720a may be electrically coupled with a DC power source 725a. Power source 725a may be configured to provide energy or voltage to the electrically conductive chuck electrode 720a. For example, electrode 720a may also be a chucking mesh that operates as electrical ground for a capacitive plasma system including an RF source electrically coupled with a showerhead. Power source 725a may include a filter, a power supply, and a number of other electrical components configured to provide a chucking voltage.

The electrostatic chuck body may also include a second bipolar electrode 720b, which may also be embedded within the chuck body 705 proximate the substrate support surface 710. Electrode 720b may be electrically coupled with a DC power source 725b. Power source 725b may be configured to provide energy or voltage to the electrically conductive chuck electrode 720b. Additionally electrical components and details about bipolar chucks according to some embodiments will be described further below.

In operation, a substrate may be in at least partial contact with the substrate support surface 710 of the electrostatic chuck body 705, which may produce a contact gap, and which may essentially produce a capacitive effect between a surface of the pedestal and the substrate. Voltage may be applied to the contact gap, which may generate an electrostatic force for chucking. The power supplies 725a and 725b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Electrodes 720a and 720b may also be coupled with an RF power source 730, which may supply RF power to the electrodes. The RF power may be supplied to the electrodes to form a plasma of a precursor within the processing region of the semiconductor processing chamber, although other plasma operations may similarly be sustained. The electrodes may serve as companion electrodes to the faceplate in order to form capacitively coupled plasma within the processing region. In some embodiments, electrodes 720a and 720b may operate as a ground path for RF power from the RF power source 730, while also operating as an electric bias to the substrate to provide electrostatic clamping of the substrate to the substrate support surface.

Chuck body 705 may also define a recessed region 735 within the substrate support surface 710, which may provide a recessed pocket in which a substrate may be disposed. Recessed region 735 may be formed at an interior region of the top puck and may be configured to receive a substrate for processing. Recessed region 735 may encompass a central region of the electrostatic chuck body 705 as illustrated, and may be sized to accommodate any variety of substrate sizes. A substrate may be seated within the recessed region 735, and contained by an exterior region 740, which may encompass the substrate. In some embodiments the height of exterior region 740 may be such that a substrate is level with or recessed below a surface height of the substrate support surface 710 at exterior region 740. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 705 and/or the stem 715 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 705 may also include an embedded heater 745 contained within the chuck body. Heater 745 may include a resistive heater or a fluid heater in embodiments. Heater 745 may include a polymer heater bonded or coupled with the chuck body material, although a conductive element may be embedded within the electrostatic chuck body and configured to receive current, such as AC current, to heat the top puck. The current may be delivered through the stem 715 through a similar channel as the DC power discussed above. Heater 745 may be coupled with a power supply 750, which may provide current to a resistive heating element to facilitate heating of the associated chuck body and/or substrate. Heater 745 may include multiple heaters in embodiments, and each heater may be associated with a zone of the chuck body, and thus exemplary chuck bodies may include a similar number or greater number of zones than heaters. The chucking mesh electrodes 720 may be positioned between the heater 745 and the substrate support surface 710 in some embodiments, and a distance may be maintained between the electrode within the chuck body and the substrate support surface in some embodiments as will be described further below. For example, a vertical distance between the chucking mesh electrodes 720 and the heater 745 may be between or about 6 mm and 30 mm, between or about 7 mm and 25 mm, between or about 8 mm and 20, or between or about 9 mm and 15 mm.

The heater 745 may be capable of adjusting temperatures across the electrostatic chuck body 705, as well as a substrate residing on the substrate support surface 710. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Substrate support assembly 700 may include a floating (i.e., not coupled with a power source) mesh 755, which may be embedded within the electrostatic body 705. For example, the mesh 755 may be positioned at a height that is between the heater 745 and the first and second bipolar electrodes 720. Typically, a peripheral edge of the mesh 755 may be vertically aligned or substantially vertically aligned with peripheral edges of the heater 745 and/or bipolar electrodes 720 such that the mesh 755 extends through an entire vertical spacing formed between the heater 745 and the bipolar electrodes 720. For example, a difference in radial position of the peripheral edges of the components may each be within or about 10%, within or about 5%, within or about 3%, within or about 1%, or less. In some embodiments, a peripheral edge of the mesh 755 may extend radially outward of the peripheral edge of the heater 745 and/or bipolar electrodes 720.

The mesh 755 may be formed of a conductive material that has a similar coefficient of thermal expansion as the chuck body 705. For example, a difference in the coefficient of thermal expansion of the mesh 755 and the chuck body 705 may be less than or about 20%, less than or about 15%, less than or about 10%, less than or about 5%, less than or about 3%, less than or about 1%, or less. In a particular embodiment, the mesh 755 may include molybdenum, although other conductive materials may be used in various embodiments. The mesh 755 may be formed from a number of wires and/or rods. For example, in one embodiment, the mesh 755 may include at least one layer of wires arranged along a first direction and a second layer of wires that are arranged along a second direction that is at least substantially orthogonal (within or about 10 degrees of orthogonal, within or about 5 degrees of orthogonal, within or about 3 degrees of orthogonal, within or about 1 degree of orthogonal, or less) to the first direction. In some embodiments, mesh 755 may be a single layer, while in other embodiments multiple layers of material may be used to form the mesh 755. In some embodiments, the wires may be woven together to form mesh 755. In some embodiments, the mesh 755 may have a thickness that is between or about 0.5 mm and 1.5 mm, between or about 0.6 mm and 1.2 mm, between or about 0.7 mm and 1 mm, or about 0.8 mm.

The mesh 755 may be positioned between about 40% and 60% of a distance from the heater 745 and the first and second bipolar electrodes 720. For example, the mesh 755 may be positioned between or about 2 mm and 15 mm from the heater 745 and/or the bipolar electrodes 720, between or about 3 mm and 10 mm from the heater 745 and/or the bipolar electrodes 720, or between or about 4 mm and 6 mm from the heater 745 and/or the bipolar electrodes 720. In some embodiments, the mesh 755 may be spaced equally apart from the heater 745 and/or the bipolar electrodes 720, while in other embodiments the mesh 755 may be closer to or further from the heater 745 than the bipolar electrodes 720. In a particular embodiment, the mesh 755 may be closer to the heater 745 than to the bipolar electrodes 720.

The presence of mesh 755 between the heater 745 and bipolar electrodes 720 may help decouple the RF mesh of the bipolar electrodes 720 from the heater 745. For example, the mesh 755 may act like a Faraday cage to shield the heater 745 from an RF field produced using the bipolar electrodes 720. Mesh 755 may provide a substantially uniform surface that enables the RF coupling between each of the bipolar electrodes 720 and mesh 755 to be substantially uniform and may help reduce the frequency sensitivity of processing operations performed on substrate support assembly 700.

Figure 8:
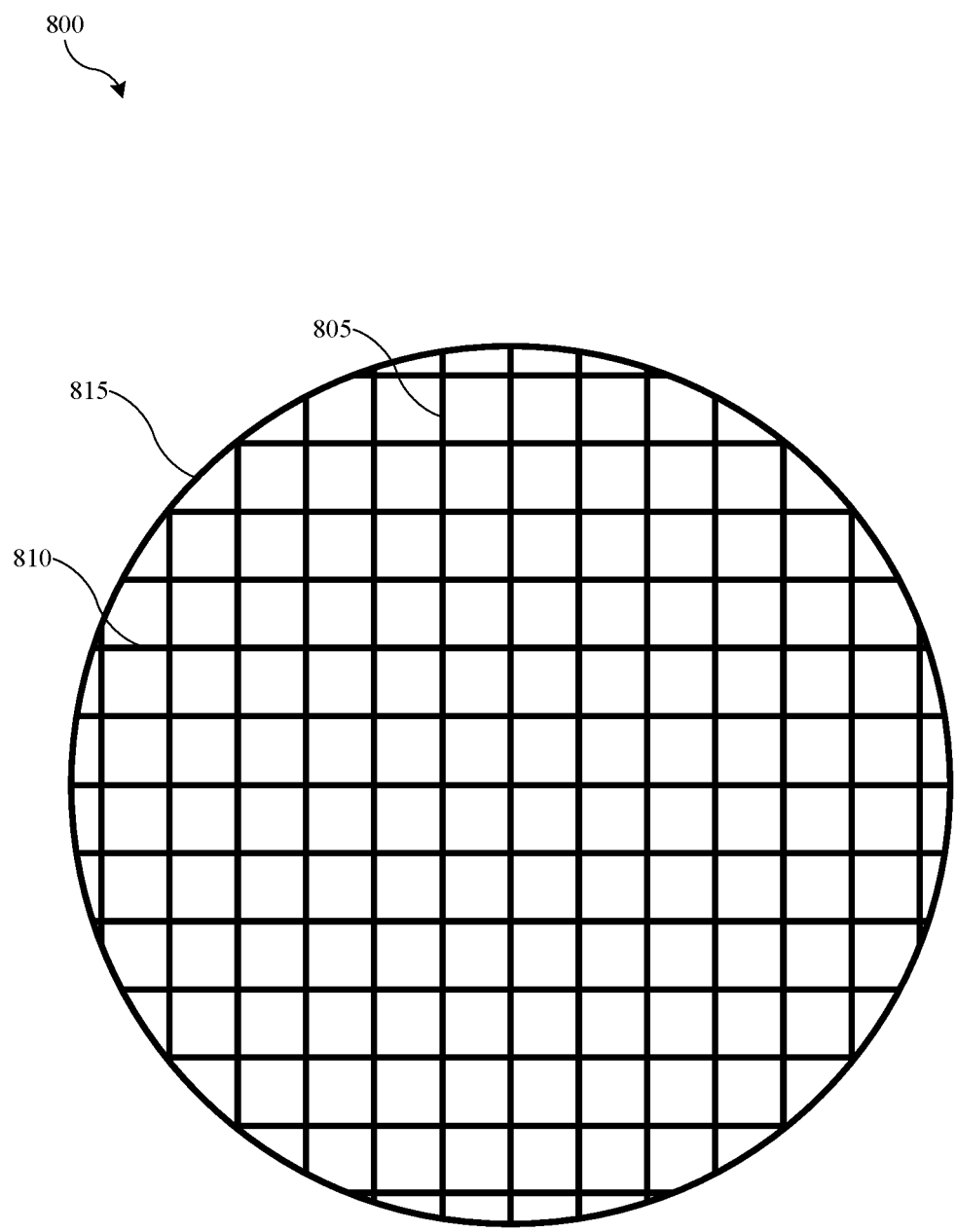
FIG. 8 shows a schematic top plan view of an exemplary mesh according to some embodiments of the present technology.

FIG. 8 illustrates a top plan view of a mesh 800 of an exemplary substrate processing system according to some embodiments of the present technology. Mesh 800 may illustrate additional features of any mesh previously described, and may include any feature or characteristic as discussed above. Mesh 800 may include first wires 805 arranged along a first direction and second wires 810 extending along a second direction that is generally orthogonal to the first direction. In some embodiments, the wires may be woven together, while in other embodiments the wires in each direction may be stacked in two or more separate layers. In yet other embodiments, a single layer of material may be used to form mesh 800. Mesh 800 may have between or about 10 and 40 wires per inch in each direction, between or about 15 and 30 wires per inch, or between about 20 and 25 wires per inch. Such a design may create a generally uniform spacing and density of wire across the area of the mesh 800 to improve the uniformity of RF coupling with the RF mesh and to reduce the frequency sensitivity of processing operations, although other mesh designs are possible in various embodiments. The mesh 800 may be generally disc shaped in some embodiments. In such embodiments, the mesh 800 openings between the wires (or other openings) of the mesh 800 may enable a power rod and/or wire to pass through the mesh to couple one or more RF electrodes with an RF power source. In some embodiments, the mesh 800 may include a peripheral wire 815 that extends about the outer periphery of the mesh 800 to enclose the mesh created by the first wires 805 and second wires 810. In other embodiments, the mesh 800 may omit the peripheral wire 815 such that ends of each of the first wires 805 and second wires 810 remain exposed.

Figure 9:
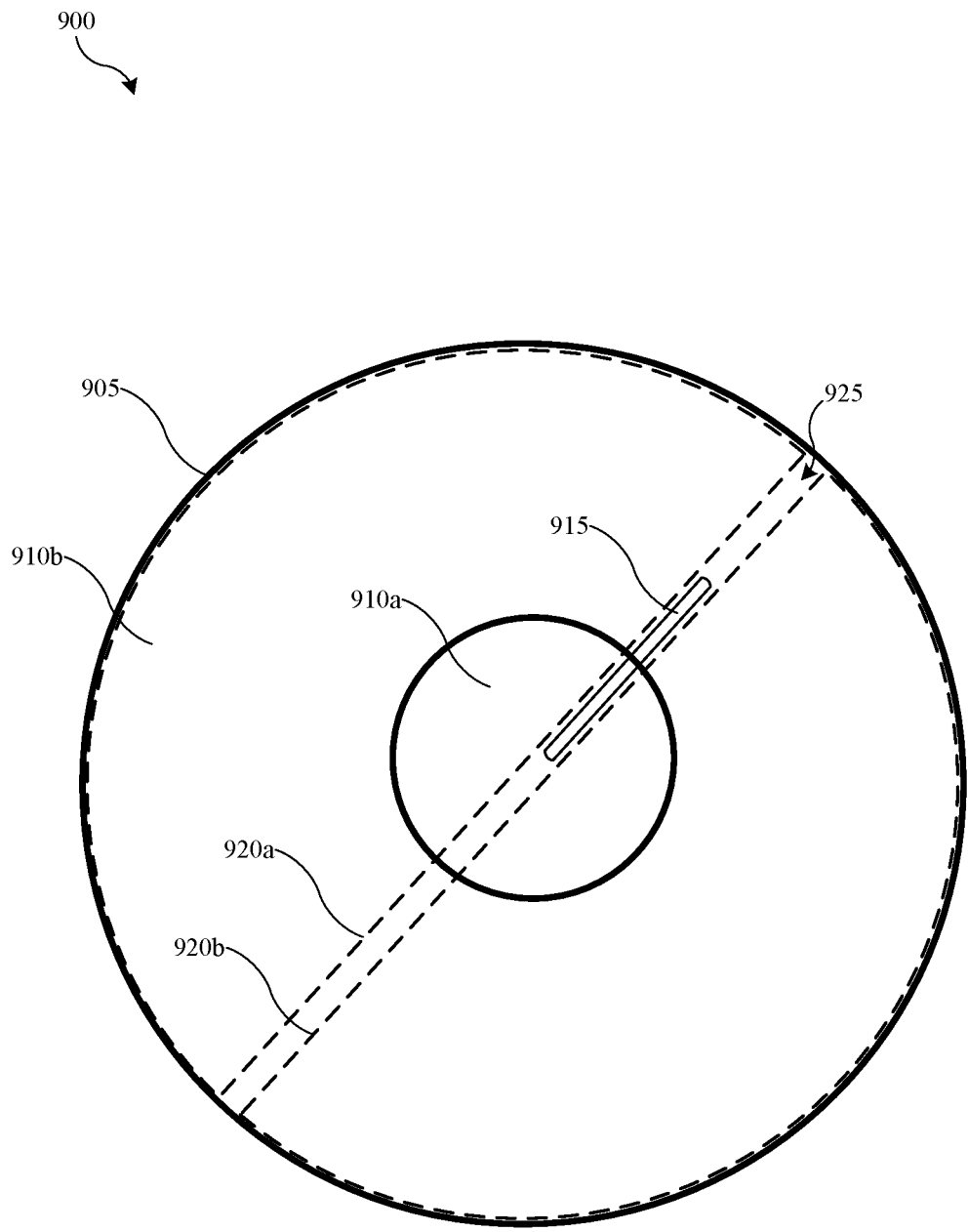
FIG. 9 shows a schematic top plan view of an exemplary arrangement of a substrate support assembly according to some embodiments of the present technology.

FIG. 9 shows a schematic top view of an arrangement 900 for an exemplary substrate support assembly according to some embodiments of the present technology. Arrangement 900 may be incorporated into any substrate support assembly, including those previously described herein. Arrangement 900 may include a heater 905, which may be any of the heaters previously described, such as heater 745. The heater 905 may be embedded in a puck or chuck body as described above, such as a ceramic including aluminum nitride, and may be characterized by any of the features, configurations, or characteristics as discussed above for any substrate support. Heater 905 may be divided into a number of heater zones 910. For example, heater 905 may be divided into two heater zones 910. For example, a center circular heater zone 910a is encircled by an annular heater zone 910b, with the heater zones 910 being concentric with one another. Such an arrangement of heater zones 910 may enable radial tuning of the temperature of a substrate support surface and substrate. While shown with two heater zones, it will be appreciated that any number of heater zones may be used in various embodiments. Each heater zone 910 may be coupled with a power rod or wire that extends up through a stem of the substrate support assembly, which may supply current to heat the respective heater zone 910. To couple the annular heater zone 910b with a power rod, a jump line 915 may be included that extends from the center of the substrate support assembly to the annular heater zone 910b. This jump line 915 may introduce a uniformity issue, by preventing the annular heater zone 910b from being completely symmetrical. This asymmetry of the annular heater zone 910b may cause RF impedance uniformity issues for bipolar electrodes 920 of the substrate support assembly, which may lead to on wafer film uniformity problems.

To combat the asymmetry of the annular heater zone 910b, the bipolar electrodes 920 in arrangement 900 may be oriented based on the position of the jump line 915. Electrodes 920 in arrangement 900 may be any of the electrodes previously described, such as may be included in substrate support assembly 700, or any other number of pedestals or chucks. The electrodes 920 may be operable as an electrostatic chuck as discussed above. As illustrated, arrangement 900 may include a first bipolar electrode 920a, and a second bipolar electrode 920b. The electrodes 920 may be embedded in a puck or chuck body as described above, such as a ceramic including aluminum nitride, and may be characterized by any of the features, configurations, or characteristics as discussed above for any substrate support.

First bipolar electrode 920a and second bipolar electrode 920b may each include a mesh material that may be substantially coplanar across both electrodes within the electrostatic chuck. The mesh materials may be characterized by any number of shapes or geometries. As illustrated, each mesh material has a semicircular shape, however other shapes such as rectangles, or any other shape may be used, which may be at least in part determined from substrate geometries, for example. The meshes of the first bipolar electrode 920a and the second bipolar electrode 920b may be separated by a gap 925. The gap 925 may be generally aligned (such as within or about 10 degrees, within or about 5 degrees, within or about 3 degrees, within or about 1 degree, or less) with the jump line 915. By aligning the jump line 915 and the electrode gap 925, the asymmetry of the RF impedance between the electrodes 920 and the heater 905 may be reduced, as the portion of the heater 905 that is directly below each respective electrode 920 may be at least substantially uniform/symmetrical. Arrangement 900 may or may not include a floating mesh disposed between the electrodes 920 and the heater 905 as described elsewhere herein.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate processing system comprising:
   a chamber body defining a transfer region;
   a lid plate seated on the chamber body, wherein the lid plate defines a plurality of apertures through the lid plate; and
   a plurality of lid stacks equal to a number of apertures defined through the lid plate, wherein the plurality of lid stacks at least partially define a plurality of processing regions vertically offset from the transfer region;
   a plurality of substrate support assemblies equal to the number of apertures defined through the lid plate, each substrate support assembly of the plurality of substrate support assemblies being disposed in a respective one of the plurality of processing regions, wherein each substrate support assembly of the plurality of substrate support assemblies comprises:

an electrostatic chuck body defining a substrate support surface that defines a substrate seat;

a heater embedded within the electrostatic chuck body, wherein the heater comprises an inner heater zone and an outer heater zone and a jump line that couples the outer heater zone with a power rod;

a first bipolar electrode embedded within the electrostatic chuck body between the heater and the substrate support surface;

a second bipolar electrode embedded within the electrostatic chuck body between the heater and the substrate support surface; and a conductive mesh embedded within the electrostatic chuck body between the heater and the first and second bipolar electrodes, wherein the conductive mesh is electrically floating.

2. The substrate processing system of claim 1, wherein: the conductive mesh comprises molybdenum.

3. The substrate processing system of claim 1, wherein: peripheral edges of the heater and the conductive mesh are at least substantially vertically aligned with peripheral edges of the first and second bipolar electrodes.

4. The substrate processing system of claim 1, wherein: the conductive mesh is positioned between about 40% and 60% of a distance from the heater and the first and second bipolar electrodes.

5. The substrate processing system of claim 1, further comprising:

a faceplate positioned atop the lid plate; and a blocker plate seated on the faceplate.

6. The substrate processing system of claim 5, further comprising:

a faceplate heater seated on the faceplate and positioned radially outward of the blocker plate.

7. The substrate processing system of claim 5, further comprising:

a gasbox seated on the blocker plate.

8. The substrate processing system of claim 1, wherein: the conductive mesh is closer to the heater than to the first and second bipolar electrodes.

9. The substrate processing system of claim 8, wherein: the conductive mesh comprises:

a first plurality of wires arranged along a first direction; and a second plurality of wires arranged along a second direction that is at least substantially orthogonal to the first direction.

10. The substrate processing system of claim 1, wherein: a thickness of the conductive mesh is between about 0.5 mm and 1.5 mm.

11. The substrate processing system of claim 1, wherein: a gap between the first bipolar electrode and the second bipolar electrode is aligned with the jump line.

12. The substrate processing system of claim 1, further comprising:

an RF power supply coupled with both of the first bipolar electrode and the second bipolar electrode.

13. A substrate processing chamber substrate support assembly, comprising:

an electrostatic chuck body defining a substrate support surface that defines a substrate seat;

a heater embedded within the electrostatic chuck body, wherein the heater comprises an inner heater zone and an outer heater zone and a jump line that couples the outer heater zone with a power rod;

a first bipolar electrode embedded within the electrostatic chuck body between the heater and the substrate support surface;

a second bipolar electrode embedded within the electrostatic chuck body between the heater and the substrate support surface; and a conductive mesh embedded within the electrostatic chuck body between the heater and the first and second bipolar electrodes, wherein the conductive mesh is electrically floating.

14. The substrate processing chamber substrate support assembly of claim 13, wherein:

the conductive mesh is positioned between about 40% and 60% of a distance from the heater and the first and second bipolar electrodes.

15. The substrate processing chamber substrate support assembly of claim 13, wherein:

the heater comprises:

a gap between the first bipolar electrode and the second bipolar electrode is aligned with the jump line.

16. The substrate processing chamber substrate support assembly of claim 13, wherein:

a thickness of the conductive mesh is between about 0.5 mm and 1.5 mm.

17. The substrate processing chamber substrate support assembly of claim 13, wherein:

the conductive mesh comprises a conductive material having a coefficient of thermal expansion that is within about 20% of a coefficient of thermal expansion of the electrostatic chuck body.

18. A substrate processing system comprising:

a processing chamber defining a processing region;

a substrate support assembly comprising:

an electrostatic chuck body defining a substrate support surface that defines a substrate seat;

a heater embedded within the electrostatic chuck body, wherein the heater comprises an inner heater zone and an outer heater zone and a jump line that couples the outer heater zone with a power rod;

a first bipolar electrode embedded within the electrostatic chuck body between the heater and the substrate support surface;

a second bipolar electrode embedded within the electrostatic chuck body between the heater and the substrate support surface; and a conductive mesh embedded within the electrostatic chuck body between the heater and the first and second bipolar electrodes, wherein the conductive mesh is electrically floating; and a faceplate positioned above the substrate support assembly.

19. The substrate processing system of claim 18, further comprising:

a blocker plate seated on the faceplate.

* * * * *